(12) United States Patent
Vice

(10) Patent No.: US 8,174,313 B2
(45) Date of Patent: May 8, 2012

(54) APPARATUS AND METHOD FOR CONTROLLING POWER AMPLIFIER

(75) Inventor: Michael Wendell Vice, El Granada, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 12/781,221

(22) Filed: May 17, 2010

(65) Prior Publication Data
US 2011/0279179 A1  Nov. 17, 2011

(51) Int. Cl.
*H03G 3/20* (2006.01)
(52) U.S. Cl. ............... 330/127; 330/297; 330/279
(58) Field of Classification Search .......... 330/296–297, 330/285, 127, 279
See application file for complete search history.

(56) References Cited

U.S. PATENT DOCUMENTS

| 6,696,866 | B2 | 2/2004 | Mitzlaff | |
|---|---|---|---|---|
| 6,788,151 | B2 * | 9/2004 | Shvarts et al. | 330/297 |
| 6,888,409 | B1 * | 5/2005 | Taylor | 330/297 |
| 7,728,663 | B2 * | 6/2010 | Rabjohn et al. | 330/124 R |
| 2007/0014382 | A1 | 1/2007 | Shakeshaft et al. | |
| 2009/0160548 | A1 | 6/2009 | Ishikawa et al. | |
| 2009/0191826 | A1 | 7/2009 | Takinami et al. | |
| 2009/0289720 | A1 | 11/2009 | Takinami et al. | |

\* cited by examiner

*Primary Examiner* — Hieu Nguyen

(57) ABSTRACT

An apparatus for controlling a power amplifier configured to amplify radio frequency (RF) signal includes a detector and a controller. The detector is configured to detect a power level of the RF signal with respect to a predetermined power threshold and to generate a corresponding detection signal. The controller is configured to provide a control voltage to an output transistor of the amplifier based on the detection signal. The control voltage has a low voltage value, which is substantially the same as a value of a supply voltage, when the detection signal indicates that the power level is below the power threshold, and the control voltage has a high voltage value when the detection signal indicates that the power level is above the power threshold. The controller generates the high voltage value by boosting the supply voltage.

18 Claims, 10 Drawing Sheets

APPARATUS AND METHOD FOR CONTROLLING POWER AMPLIFIER

BACKGROUND

Wireless communications systems are designed around various modulation schemes, such as orthogonal frequency-division multiplexing (OFDM) and code division multiple access (CDMA), intended to provide efficient utilization of the allocated spectrum. Spectrally efficient modulation schemes have high crest factors (e.g., peak to average power ratios). However, proper conveyance of data and acceptable spectral re-growth characteristics place a linearity burden on the transmit chain, including a power amplifier.

In order to achieve the required linearity, conventional systems typically require substantial power back-off from saturation of an output transistor in the power amplifier, which significantly reduces efficiency. In portable equipment, such as cellular telephones, reduction in efficiency translates into shorter battery life and reduced operating time between battery recharges. Generally, the industry trend is to increase the interval between battery recharges and/or to decrease the size of the batteries. Therefore, the efficiency of amplifiers should be increased while still meeting linearity requirements.

SUMMARY

In a representative embodiment, an apparatus for controlling operation of a power amplifier configured to amplify a radio frequency (RF) signal includes a detector and a controller. The detector is configured to detect a power level of the RF signal with respect to a predetermined power threshold and to generate a corresponding detection signal. The controller is configured to provide a control voltage to an output transistor of the amplifier based on the detection signal, the control voltage having a low voltage value, which is substantially the same as a value of a supply voltage, when the detection signal indicates that the power level is below the power threshold, and the control voltage having a high voltage value when the detection signal indicates that the power level is above the power threshold. The controller generates the high voltage value by boosting the supply voltage.

In another representative embodiment, a control device for controlling a power amplifier configured to amplify an RF signal includes a detector encoder, a switch sequencer and a power switch. The detector encoder is configured to receive an analog detection signal from a detector and to translate the detection signal into multiple digital detection signals, the analog detection signal indicating a power level of the RF signal. The switch sequencer is configured to translate the digital detection signals from the detector encoder into multiple input signals in a predetermined sequence. The power switch is configured to provide an output voltage to the power amplifier in response to the input signals received from the switch sequencer, the output voltage having a first value corresponding to a supply voltage from a supply voltage source when the power level of the RF signal is below a predetermined power threshold, and having a second value corresponding to the supply voltage plus a voltage boost when the power level of the RF signal is above the power threshold. The second value of the output voltage enables the power amplifier to operate above saturation voltage when the power level is above the power threshold.

In yet another representative embodiment, a method is provided for selectively boosting a drain supply voltage of an output transistor in a power amplifier amplifying an RF signal. The method includes providing a supply voltage as the drain supply voltage by turning on a switching transistor to directly connect a supply voltage source to the output transistor, and connecting a charge storage capacitor between the supply voltage source and ground to charge the capacitor to a voltage boost value; evaluating a magnitude of an envelope of the RF signal and detecting when a lowest occurring voltage extreme of the envelope becomes less than a first predetermined voltage level; providing a boosted voltage as the drain supply voltage when the lowest occurring voltage extreme of the envelope becomes less than the predetermined voltage level by turning off the switching transistor and connecting the charge storage capacitor between the supply voltage source and the output transistor, the boosted voltage including the supply voltage plus the voltage boost value previously stored in the charge storage capacitor; detecting when the lowest occurring voltage extreme of the envelope becomes greater than a second predetermined voltage level; and providing the supply voltage as the drain supply voltage by turning on the switching transistor to directly connect the supply voltage source to the output transistor.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

An envelope tracking technique may be used to improve amplifier efficiency. Generally, a drain supply voltage provided to the output transistor of the power amplifier (or collector supply voltage, depending on the type of output transistor) is modulated to provide the output transistor the voltage required by the carrier envelope at each point in time, but no more. In comparison, whereas a traditional amplifier may provide 3.3V to the drain of the output transistor at all times, the envelope tracking technique provides real time optimization of the drain supply voltage, so that the drain supply voltage is sufficient, but not excessive, at all times. The envelope tracking technique therefore enhances efficiency, particularly at times when the carrier envelope is below maximum.

Conventional envelope tracking techniques involve a linear tracking voltage supply, which is modulated by an envelope detector. Such a system is cumbersome, however, because it includes a continuously variable DC-to-DC converter, which typically requires a large high-Q inductor.

According to various embodiments, an envelope tracking technique is provided that requires no continuously variable DC-to-DC converter. Rather, the drain supply voltage (or collector supply voltage) provided to the output transistor of the power amplifier is adjusted to be one of two values, depending on the envelope of the radio frequency (RF) carrier signal, to ensure that the output transistor has sufficient drain supply voltage required by the carrier envelope. For example, the two drain supply voltages may be a supply voltage (e.g., provided by a battery) and a boosted voltage that is about twice the supply voltage (e.g., the battery supply voltage plus a voltage boost). Selective application of the boosted voltage to the drain of the output transistor enables the output transistor to continue to operate properly when maximum power output is required.

Figure 1:
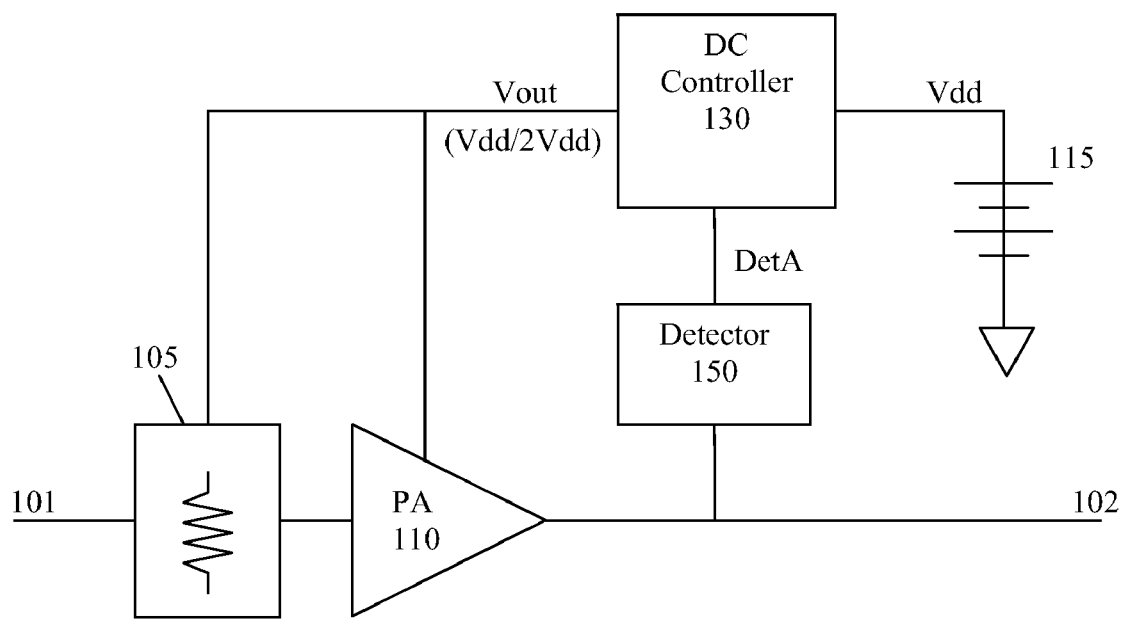
FIG. 1 is a block diagram illustrating an amplifier control circuit, according to a representative embodiment.

FIG. 1 is a block diagram illustrating an amplifier control circuit, according to a representative embodiment.

Figure 6:
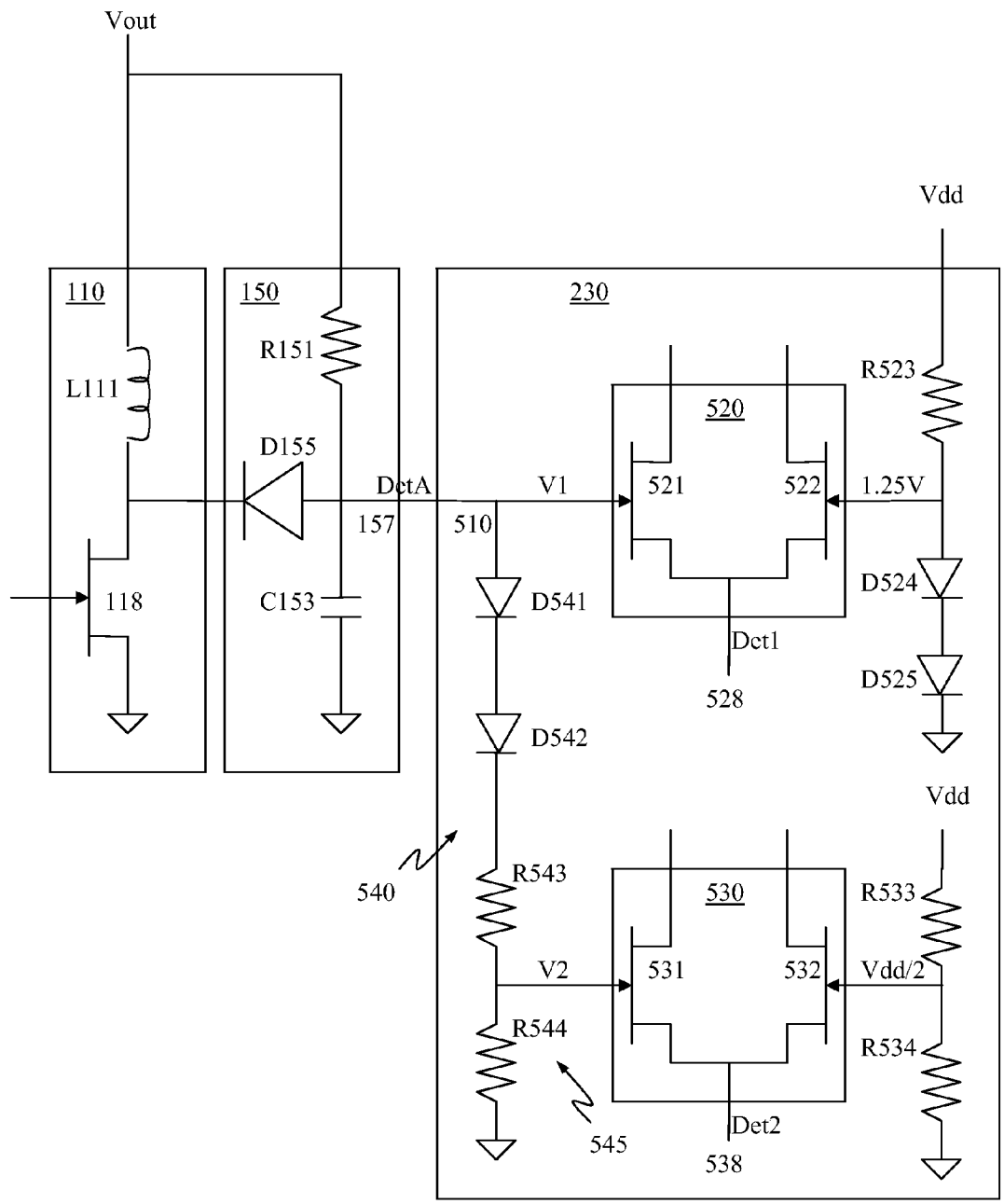
FIG. 6 is a circuit diagram illustrating the detector encoder of the DC controller, and the amplifier and detector of the amplifier control circuit, according to a representative embodiment.

Referring to FIG. 1, amplifier circuit 100 includes attenuator 105, power amplifier 110, DC controller 130 and detector 150. The amplifier 110 is configured to amplify an RF signal received by the amplifier circuit 100 through signal input port 101 via the attenuator 105, and to output an amplified RF signal from signal output port 102. The amplifier 110 includes an output transistor, which may be a field effect transistor (FET), for example, such as a gallium arsenide field-effect transistor (GaAs FET). However, other types of FETs and/or other types of transistors within the purview of one of ordinary skill in the art may be incorporated into the amplifier 110, without departing from the scope of the present teachings. For example, the output transistor may be a metal-oxide semiconductor FET (MOSFET), a bipolar junction transistor (BJT), a high electron mobility transistor (HEMT), a pseudomorphic HEMT (pHEMT), a heterostructure FET (HFET), etc. An example of the amplifier 110 including an output FET (e.g., transistor 118) is shown in FIG. 6, discussed below.

For purposes of discussion, terms typically corresponding to FETs, such as drain, supply and gate, are used herein to describe the output transistor of the amplifier 110, although it is understood that these terms are not intended to be limiting, and that corresponding terms, such as emitter, collector and base, would be applicable for other types of transistors in various alternative configurations, such as BJTs.

Generally, the DC controller 130 provides voltage Vout as the drain supply voltage for the output transistor of the amplifier 110. The drain supply voltage is switched between two values, depending on the envelope of the RF signal. In an embodiment, the smaller of the two voltages is the supply voltage (Vdd), and the larger voltage of the two voltages is approximately twice the supply voltage (2Vdd). For purposes of discussion, it is assumed that the amplifier circuit 100 is included in a portable electronic device that is powered by a battery, and thus the smaller voltage will be referred to as supply voltage Vdd (e.g., about 3.3V) provided by battery 115, and the larger voltage will be referred to as the boosted voltage Vboost (e.g., about 6.6V), which is equal to the supply voltage Vdd (e.g., about 3.3V) plus a voltage boost Vb (e.g., about 3.3V). Accordingly, the drain supply voltage supports the maximum required power output only when that output is specifically demanded. Otherwise, the drain supply voltage is the battery supply voltage, which is about half the boosted voltage, thus saving battery power.

When no RF power is presented to the amplifier 110, the DC controller 130 provides the supply voltage Vdd as Vout, and thus the drain supply voltage of the output transistor is the same as the supply voltage Vdd. As the RF power level increases, the drain voltage swings in both positive and negative excursions in an operational envelope about the DC level. According to various embodiments, the envelope magnitude is effectively evaluated by the detector 150 in terms of the lowest occurring voltage extreme at the drain of the output transistor. The larger the RF power level, the lower the lowest voltage extreme will be. When lowest voltage extreme falls below a predetermined level, as indicated by the detector 150, the DC controller 130 switches to provide the boosted voltage Vboost as Vout, which is roughly twice the previously available voltage to the drain, as discussed above. For example, assuming for purposes of explanation that the output transistor of the amplifier 110 is a FET, the predetermined level may correspond to onset of the triode region of operation for the output transistor, at which point the amplifier 110 no longer operates properly (e.g., in saturation) and begins to compress severely. The voltage below which the amplifier 110 no longer has good amplifier characteristics may be referred to as the saturation voltage. After switching, the DC controller 130 maintains the boosted voltage Vboost until the demand on the amplifier 110 is no longer high, for example, when the lowest voltage extreme of the envelope returns to above the predetermined level (or higher), as indicated by the detector 150. At this point, the DC controller 130 switches back to the supply voltage Vdd from the battery 115 as Vout.

In order to avoid unwanted distortion, the complex gain of the amplifier 110 is compensated when the drain supply voltage is increased to the boosted voltage Vboost. The complex gain compensation is performed by switched complex attenuator 105 placed in the signal path between the signal input port 101 and the amplifier 110. The attenuator 105 and the compensation circuit are discussed below with reference to FIG. 10. Although the attenuator 105 is depicted as a real attenuator, in practice, some degree of phase shift may be switched in, as well as gain reduction, thus necessitating use of a complex attenuator. Although the attenuator 105 in FIG. 1 is shown as being located at the input of the amplifier 110, it is understood that the location is merely representative of numerous other topological implementations. For instance, the attenuator 105 may be placed at an interstage point between two amplification stages of the amplifier 110, without departing from the scope of the present teachings.

Figure 2:
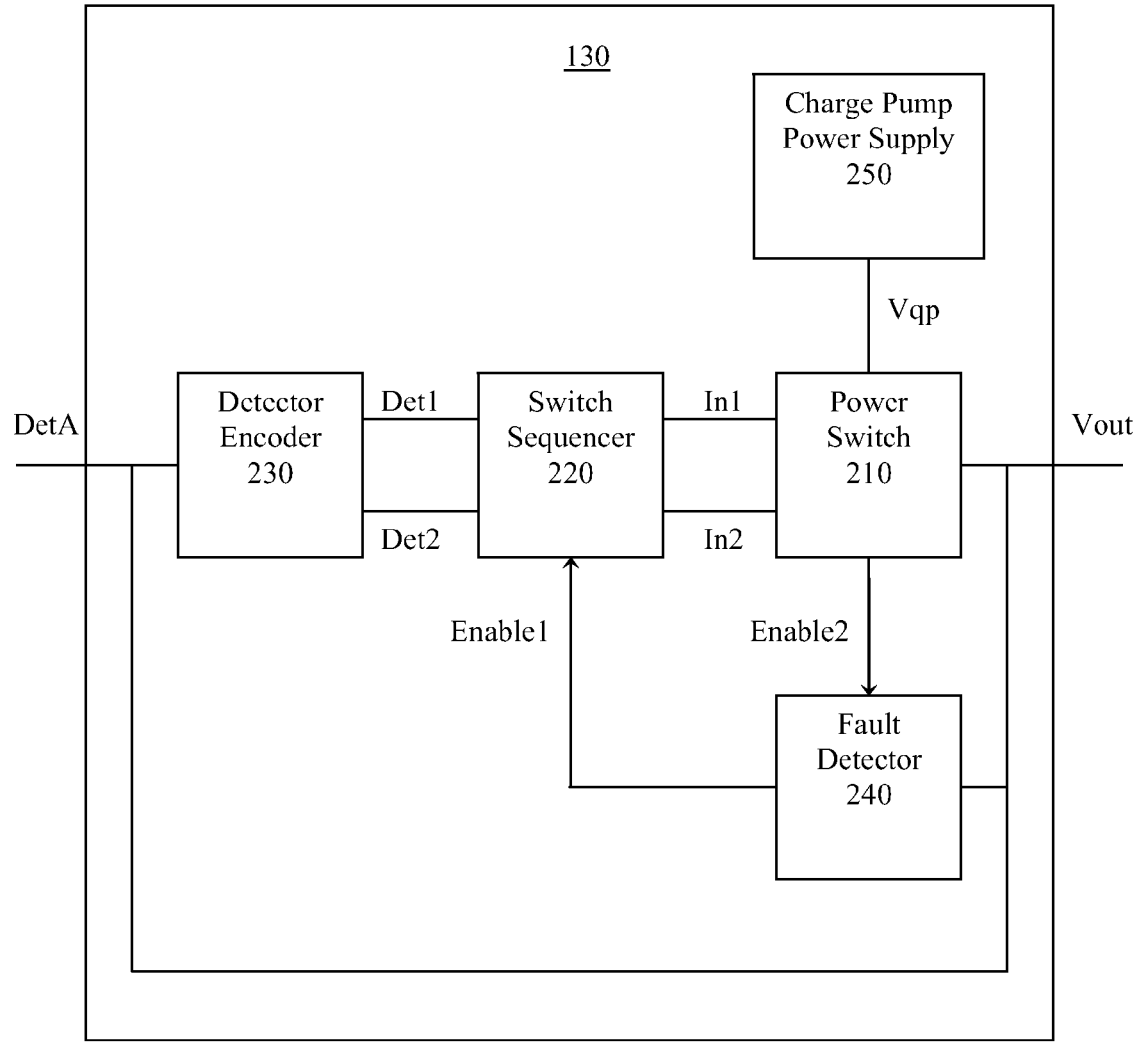
FIG. 2 is a block diagram illustrating a DC controller of the amplifier control circuit, according to a representative embodiment.

FIG. 2 is a circuit diagram illustrating DC controller 130 of the amplifier circuit 100, according to a representative embodiment.

Referring to FIG. 2, the DC controller 130 includes power switch 210, switch sequencer 220 and detector encoder 230. Generally, the detector encoder 230 receives an analog detection signal DetA output from the detector 150, which indicates when the output transistor of the amplifier 110 has reached saturation (or other boosting threshold). The detector encoder 230 translates the analog detection signal DetA into digital detection signals, which may be a word having two detection bits Det1 and Det2. The switch sequencer 220 translates the digital detection signals into first and second input signals In1 and In2, which are provided to the power switch 210. The power switch 210 coordinates switching between the supply voltage Vdd and the boosted voltage Vboost, and outputs one of the supply voltage Vdd and the boosted voltage Vboost as Vout, provided to the amplifier 110. That is, the power switch 210 operates under the control of the first and second input signals In1 and In2 either to pass through the battery supply voltage Vdd (in a pass-through state) or to boost on demand the battery supply voltage Vdd by voltage boost Vb to the boosted voltage Vboost (in a boost state), which may be equal to about twice the supply voltage Vdd. In an embodiment, Vout is also fed back to the input of the detector encoder 230, discussed below with reference to FIG. 6.

In addition, the DC controller 130 includes fault detector 240 for detecting faults and providing an enable signal to enable operation of the switch sequencer 220, discussed below with reference to FIG. 7. The DC controller 130 also includes charge pump power supply 250 for generating a charge pump voltage Vqp, which is approximately twice the supply voltage Vdd, for operating a transistor gate in power switch 210, discussed below with reference FIGS. 3 and 9.

Figure 3:
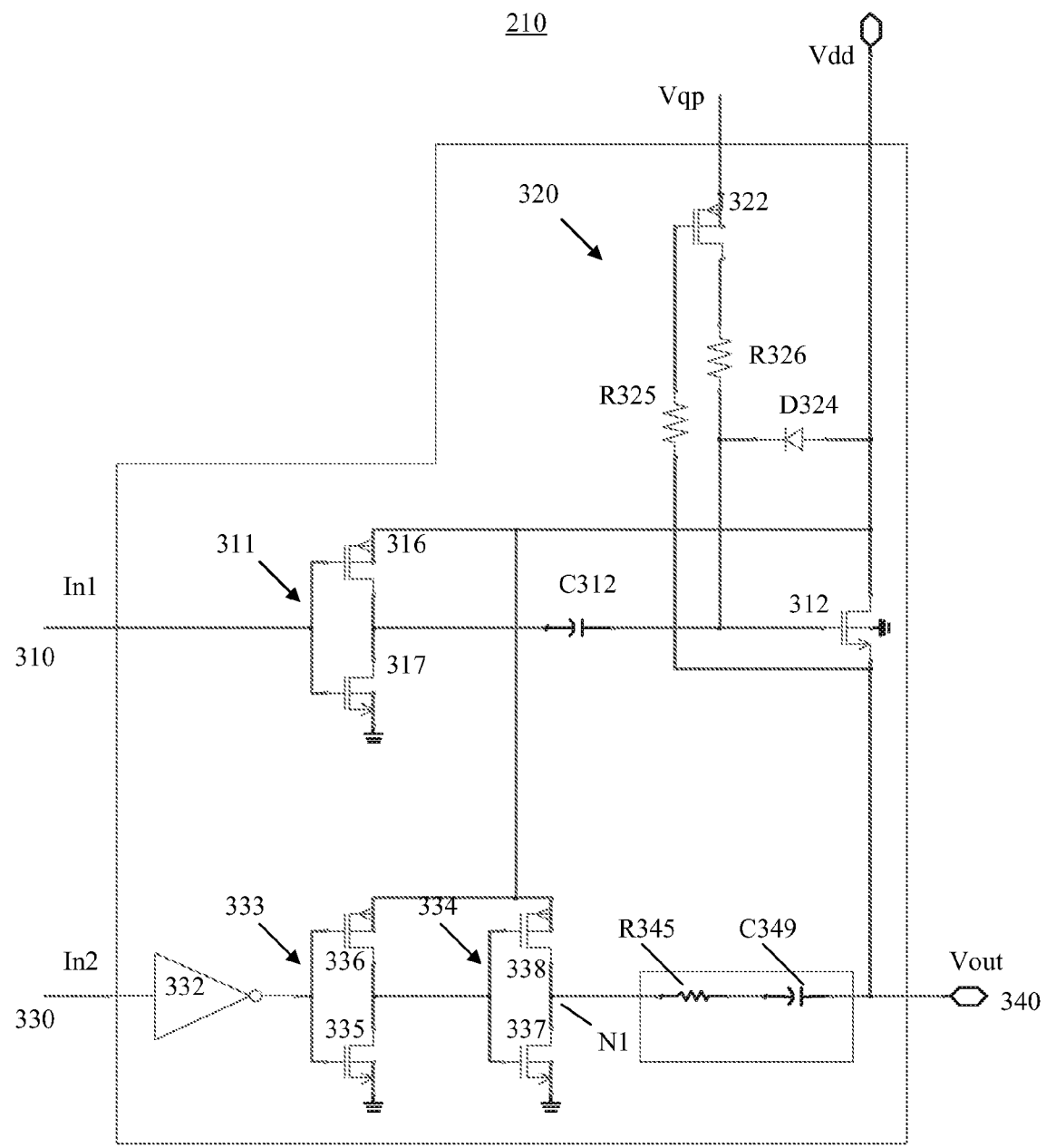
FIG. 3 is a circuit diagram illustrating a power switch of the DC controller, according to a representative embodiment.

FIG. 3 is a circuit diagram illustrating the power switch 210 of the DC controller 130, according to a representative embodiment.

Referring to FIG. 3, the power switch 210 receives the first input signal In1 at first switch input port 310 and the second input signal In2 at second switch input port 330 from the switch sequencer 220, and outputs voltage Vout from output port 340 to the power amplifier 110. As discussed above, the power switch 210 has two states with respect to the output voltage Vout. The first state (State 1) is the pass-through state, in which the voltage Vout is essentially the same as the supply voltage Vdd. The second state (State 2) is the boost state, in which the voltage Vout is the boosted voltage Vboost, which is the sum of the supply voltage Vdd and the voltage boost Vb, where boosted voltage Vboost is approximately twice the supply voltage Vdd.

In various embodiments, the power switch 210 includes switching transistor 312, which is a FET in the depicted embodiment, although other types of transistors may be incorporated without departing from the scope of the present at teachings. The switching transistor 312 has a drain connected to the power supply (e.g., battery 115 of FIG. 1) to receive the supply voltage Vdd and a source connected to the output port 340, which coincides with the output of the DC controller 130. A gate of the switching transistor 312 is connected to charge pump voltage circuit 320 to receive an enhanced gate voltage, e.g., based on charge pump voltage Vqp. The gate of the switching transistor 312 is also connected to first driver 311 and capacitor C312. In various embodiments, the capacitor C312 is implemented as an off-chip capacitor due to its large value (e.g., about 1000 pF). The first driver 311 is connected to first switch input port 310 to receive the first input signal In1 from the switch sequencer 220. In the depicted configuration, the first driver 311 is an inverter, including inverter transistors 316 and 317 having corresponding gates connected to the first switch input 310. Other types of drivers may be implemented without departing from the scope of the present teachings.

The charge pump voltage circuit 320 includes transistor 322, which is a FET in the depicted embodiment, although other types of transistors may be incorporated without departing from the scope of the present at teachings. The transistor 322 has a source connected to receive charge pump voltage Vqp from charge pump power supply 250, discussed below with reference to FIG. 9. The transistor 322 also has a drain connected to the gate of the switching transistor 312 via resistor R326, and a gate connected to the source of the switching transistor 312 via resistor R325. Diode D324 is connected between the drain and the gate of the switching transistor 312. Generally, the charge pump voltage Vqp is equal to about twice the supply voltage Vdd (2*Vdd), and is supplied to the Vqp line. The purpose of the charge pump voltage Vqp is to charge up the capacitor C312 to about 3.3V, for example. When the first driver 311 outputs a high signal, the voltage of the capacitor C312 is added to the output voltage of the first driver 311, which results in an enhanced gate voltage at the switching transistor 312 of about 6.6V, for example. This enhanced gate voltage is sufficient to enhance the channel of the switching transistor 312, so that it turns on when the drain and source are at 3.3V, for example.

The second switch input port 330 is connected to a series of multiple drivers, depicted by representative second driver 332, third driver 333 and fourth driver 334. Each of the second through fourth drivers 332-334 may be an inverter, for example, including a pair of inverter transistors, as discussed above with respect to the first driver 311, having corresponding gates connected to the second switch input port 330 for receiving the second input signal In2 from the switch sequencer 220. For purposes of discussion, only the inverter transistors of the third driver 333 (i.e., transistors 335 and 336) and the fourth driver 334 (i.e., transistors 337 and 338) are shown. The transistors 335-338 of the third and fourth drivers 333 and 334, as well as the transistors 316-317 of the first driver 311, are FETs in the depicted embodiment, although other types of transistors may be incorporated without departing from the scope of the present at teachings.

The fourth driver 334, which is the last driver in the representative series of drivers, is connected to a charge storage capacitor, which is modeled by charge storage capacitor C349 and effective series resistance R345 (collectively referred to herein as charge storage capacitor C349). In various embodiments, the charge storage capacitor C349 is implemented as an off-chip capacitor due to its large value (e.g., about 1 µF). Other types of drivers may be implemented without departing from the scope of the present teachings. In addition, the number of drivers may vary, depending on the incremental amounts by which the series of drivers respectively increase available current levels, as would be apparent to one of ordinary skill in the art.

According to the depicted embodiment, the pass-through state of the power switch 210 is achieved when switching transistor 312 and transistor 337 of the fourth driver 334 are turned on, and transistor 338 of the fourth driver 334 is turned off In this configuration, the supply voltage Vdd is passed through the switching transistor 312 to the output port 340, and supplied to the drain of the output transistor in the amplifier 110, as discussed above. Also, in the pass-through state, a capacitor node N1, between fourth driver 334 and the charge storage capacitor C349, is connected to ground (via transistor 337), so that the charge storage capacitor C349 is connected between the supply voltage Vdd and ground. This allows a capacitor voltage of the charge storage capacitor C349 to charge up to the voltage boost Vb, which is about the same as the supply voltage Vdd, during the pass-through state. As discussed below with reference to FIG. 4, the pass-through state in the depicted embodiment is set when the first input signal In1 at the first switch input port 310 is low and the second input signal In2 at the second switch input port 330 is high.

The boost state of the power switch 210 is achieved by when the switching transistor 312 and the transistor 337 of the fourth driver 334 are turned off, and the transistor 338 of the fourth driver 334 is turned on. In this configuration, the output port 340 is disconnected from the supply voltage Vdd, and is connected only to the charge storage capacitor C349. The capacitor node N1 is connected to the supply voltage Vdd (via transistor 338), thus connecting the previously charged charge storage capacitor C349 to the supply voltage Vdd. The output load at the output port 340 therefore sees the boosted voltage Vboost, which is approximately twice the supply voltage Vdd (2*Vdd), provided by the supply voltage Vdd plus the voltage boost Vb from the charge storage capacitor C349. As discussed below with reference to FIG. 4, in the depicted embodiment, the boost state is set when the first input signal In1 is high and the second input signal In2 is low.

Figure 4:
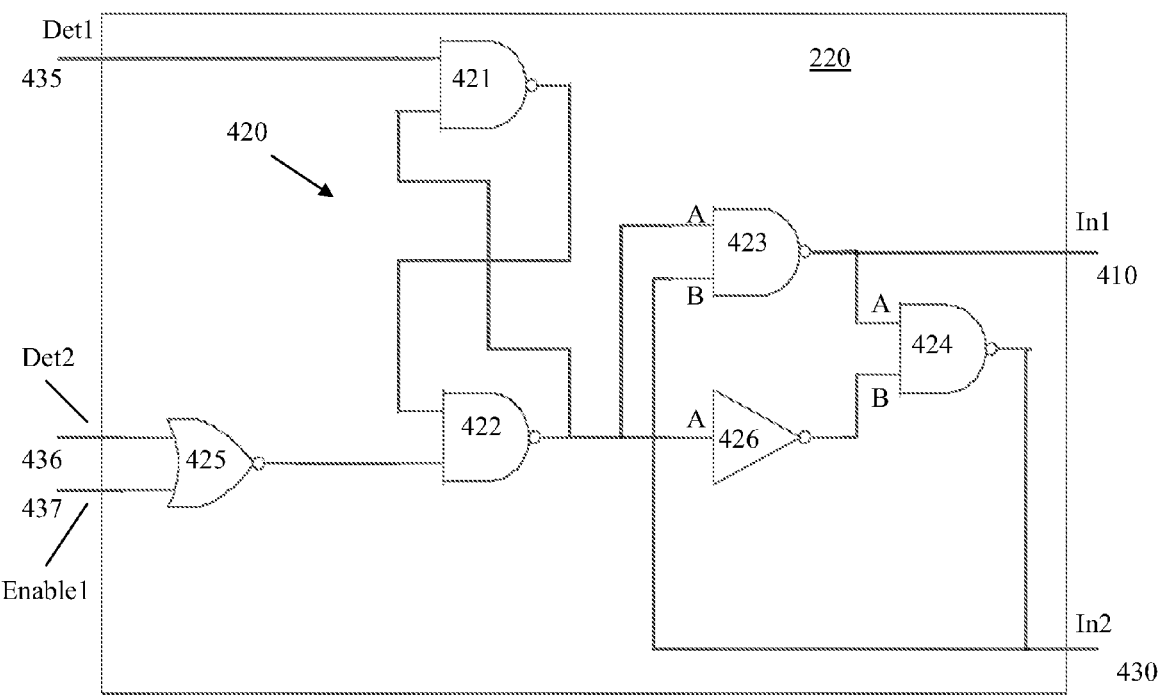
FIG. 4 is a circuit diagram illustrating a switch sequencer of the DC controller, according to a representative embodiment.

FIG. 4 is a circuit diagram illustrating the switch sequencer 220 of the DC controller 130, according to a representative embodiment.

Referring to FIG. 4, the switch sequencer 220 translates the first and second detection bits Det1 and Det2 received from the detector encoder 230 into first and second input signals In1 and In2, which are provided to the power switch 210. Generally, the purpose of the switch sequencer 220 is to operate the power switch 210 into the pass-through and boost states (State 1 and State 2) when needed, and to transition between the pass-through and boost states using the correct sequence, so that no shoot-through currents occur in the power switch 210. More specifically, the sequencer 220 sequences the transition between State 1 and State 2, so that at no time is the charge storage capacitor C349 shorted by the switching transistor 312. Shoot-through currents, if they were to occur, negatively impact efficiency.

In various embodiments, the switch sequencer 220 includes multiple logic gates, including NAND gates 421-424, NOR gate 425 and inverter 426. Inputs of NAND gate 421 are respectively connected to first sequencer input port 435 of the switch sequencer 220 for receiving first detection bit Det1 and the output of NAND gate 422. Inputs of NOR gate 425 are respectively connected to second sequencer input port 436 for receiving second detection bit Det2 and an enable port 437 for receiving a first enable signal Enable1 from the fault detector 240, discussed below with reference to FIG. 7. Inputs of NAND gate 422 are respectively connected to the outputs of NAND gate 421 and NOR gate 425.

Inputs of NAND gate 423 are respectively connected to the outputs of NAND gate 422 and NAND gate 424. Inputs of NAND gate 424 are respectively connected to the output of NAND gate 423 and the output of the inverter 426, which inverts the output of NAND gate 422. The outputs of NAND gates 423 and 424 are respectively connected to the first and second output ports 410 and 430 of the switch sequencer 220, which respectively provide the first and second input signals In1 and In2 to the power switch 210.

In various embodiments, the first enable signal Enable 1 is provided by the fault detector 240 to disable the boost voltage Vboost in case of a fault. The first enable signal Enable 1 is normally low, in which case the second detection bit Det2 simply passes through NOR gate 425 and appears inverted at the input to NAND gate 422.

NAND gates 421 and 422 form a flip-flop 420, the two stable states of which correspond to the two states State 1 and State 2 of the power switch 210. When the first and second detection bits Det1 and Det2 are both low, the output of the flip-flop 420 is low. In this case, the first and second input signals In1 and In2 to the power switch 210 are high and low, respectively, which corresponds to the boost state of the power switch 210 (State 2). When first detection bit Det1 goes high, it does not cause a state change in the system. A state change only occurs when the second detection bit Det2 goes high, as discussed further with respect to the detector encoder 230 in FIG. 6. When the second detection bit Det2 goes high, the output of the flip-flop 420 goes high, causing a state change. Thus, the first and second input signals In1 and In2 to the power switch 210 become low and high, respectively, which corresponds to the pass-through state (State 1) of the power switch 210. The logic states are shown in truth table, Table 1, below:

TABLE 1

| Det1 | Det2 | FF 420 | NAND 423(A) | NAND 423(B) | INV 426(A) | NAND 424(A) | NAND 424(B) | In1 | In2 |
|------|------|--------|-------------|-------------|------------|-------------|-------------|-----|-----|
| 1 | 1 | 1 | 1 | 1 | 1 | 0 | 0 | 0 | 1 |
| 1 | 0 | 1 | 1 | 1 | 1 | 0 | 0 | 0 | 1 |
| 0 | 0 | 0 | 0 | 0 | 0 | 1 | 1 | 1 | 0 |
| 1 | 0 | 0 | 0 | 0 | 0 | 1 | 1 | 1 | 0 |
| 1 | 1 | 1 | 1 | 1 | 1 | 0 | 0 | 0 | 1 |

In addition, specific transition sequences are enforced with respect to the first and second input signals In1 and In 2, in response to the transitions of the flip-flop 420, as shown in Table 2, below:

TABLE 2

| FF 420 Output | In1 | In2 |
|---------------|-----|-----|
| 1 to 0 | 0 to 1 first | 1 to 0 last |
| 0 to 1 | 1 to 0 last | 0 to 1 first |

Referring to Table 2, "first" and "last" indicate the order in which the depicted transitions occur between the first and second input signals In1 and In2 For example, when the flip-flop 420 transitions from 1 to 0, the power switch 210 enters the boost state by the first input signal In1 transiting from 0 to 1 before the second input signal In2 transitions from 1 to 0. Therefore, referring to FIG. 3, the supply voltage Vdd is switched off from the load at the output port 340 first, then the charge storage capacitor C349 is switched to the supply voltage Vdd (e.g., causing the output voltage Vout to double). Conversely, when the flip-flop 420 of the switch sequencer 220 transitions from 0 to 1, the power switch 210 enters the pass-through state by the second input signal In2 transitioning from 0 to 1 before the first input signal In1 transitions from 1 to 0. Therefore, referring again to FIG. 3, the charge storage capacitor C349 is switched to ground first, then the load at the output port 340 is switched to the supply voltage Vdd (e.g., causing the output voltage Vout to pass the supply voltage Vdd). This sequence ensures that the charge storage capacitor C349 is never shorted by the switching transistor 312, thereby avoiding shoot-through currents.

Figure 5:
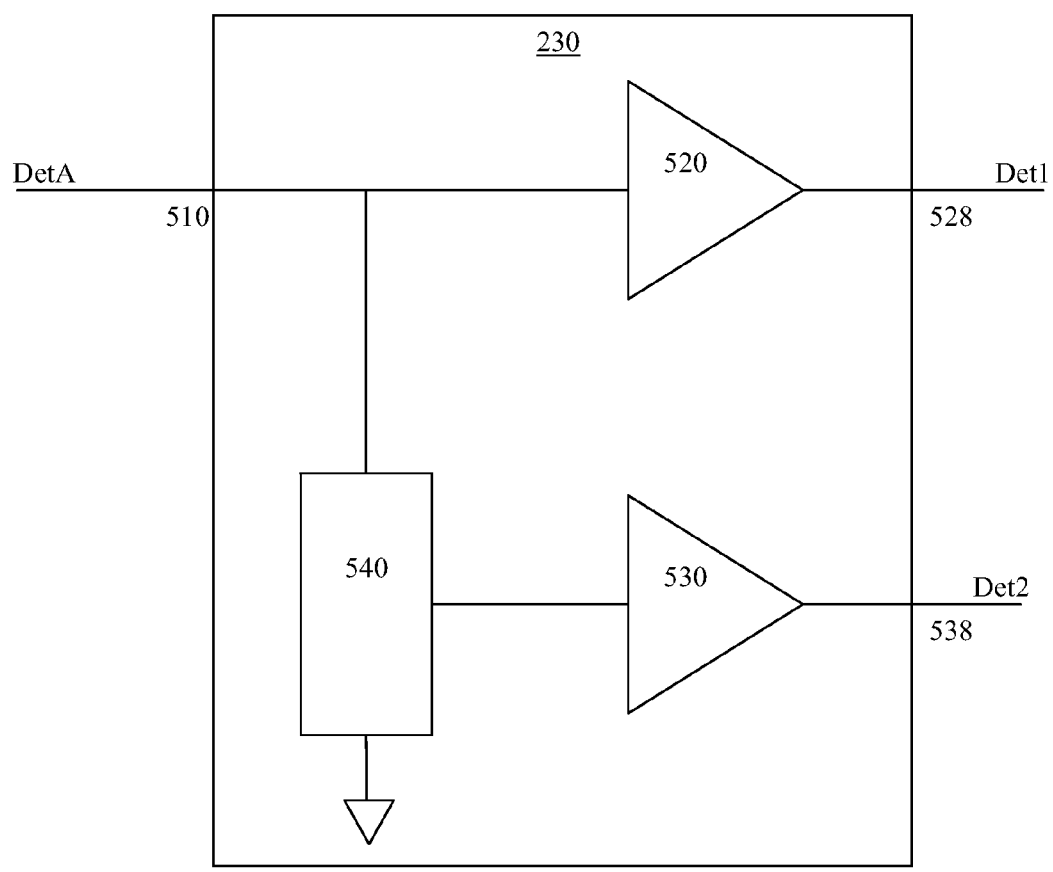
FIG. 5 is a block diagram illustrating a detector encoder of the DC controller, according to a representative embodiment.

FIG. 5 is a block diagram illustrating a detector encoder of the DC controller 130, according to a representative embodiment.

Referring to FIG. 5, detector encoder 230 produces the input states for the sequencer 220 based on the analog detection signal DetA of the detector 150. In various embodiments, the detector encoder includes first comparator 520, second comparator 530 and level shifter 540. An input of the first comparator 520 is connected to encoder input port 510 to receive the analog detection signal DetA from the detector 150, and an output of the first comparator 520 is connected to first output port 528. An input of the second comparator 530 is connected to the level shifter 540 to receive the analog detection signal DetA at a shifted voltage level, e.g., divided down, and an output of the second comparator 530 is connected to second output port 538. In various embodiments, the level shifter 540 may include one or more diodes connected in series with a voltage divider, as discussed below.

Configuration and operation of the detector encoder 230 is discussed in more detail with reference to FIG. 6, which is a circuit diagram illustrating the detector encoder 230 of the DC controller 130, together with the amplifier 110 and the detector 150 of the amplifier circuit 100, according to a representative embodiment.

In the depicted embodiment, the amplifier 110 includes output transistor 118. The output transistor 118 may be a pHEMT having a drain saturation voltage of about 0.5V, for example, although other types of transistors may be incorporated without departing from the scope of the present teachings. The output transistor 118 includes a gate, which may be connected to a driver state output, e.g., via an interstage matching network, for example. The output transistor 118 may also be connected to an attenuator, such as the attenuator 105 shown in FIG. 1, which may be placed at any point in the signal path of the amplifier 110. The output transistor 118 further includes a source connected to ground and a drain connected to inductor L111. The inductor L111 may have a value of about 10 nH, for example, although the value may vary based on the particular implementation. The voltage Vout output by the DC controller 130, e.g., via the output port 340 of the power switch 210, is provided to the drain of the output transistor 118 through the inductor L111.

Also in the depicted embodiment, the detector 150 includes diode D155, having a cathode connected to the drain of the output transistor 118 and an anode connected to detector output port 157. The diode D155 may be a gallium arsenide diode having a voltage drop of about 0.75V, for example, although other types and sizes of diodes may be incorporated without departing from the scope of the present teachings. The detector 150 also includes resistor R151 connected between the supply voltage Vdd and the anode of the diode D155, and capacitor C153 connected between the detector output port 157 and ground. The resistor R151 may have a resistance of about 10 k Ohm, for example. Also, the capacitor C153 has a value large enough to filter out the carrier frequency, yet small enough to track the carrier envelope. For example, the capacitor C153 may have a value of about 1 pF. It is understood that the topology of the detector 150, as well as the values of the resistor R151 and the capacitor C153 in the depicted topology, may vary without departing from the scope of the present teachings.

Referring to FIG. 6, it can be seen that the lowest voltage extreme (envelope peak) of the drain of the output transistor 118 will establish the voltage at the detector output port 157. In other words, the detector 150 effectively acts as a negative peak detector. Assuming for purposes of illustration that the output transistor 118 is a pHEMT with a drain saturation voltage of about 0.5V and the diode D155 is a gallium arsenide diode with a voltage drop of 0.75V, as mentioned above, the critical output voltage for the detector 150 is about 1.25V. In various embodiments, a somewhat larger critical voltage may be established to provide a margin of safety. Also, in various embodiments, the diode D155 and the capacitor C153 may be integrated with the power amplifier 110, whereas the resistor R151 and the components of the DC controller 130 may be realized in complementary metal-oxide semiconductor (CMOS), for example.

In alternative embodiments, the power level at the amplifier 110 may be determined by various means other than directly detecting the onset of compression in the output transistor 118, e.g., by comparing the negative peak of the carrier envelope with a predetermined value, as described above, without departing from the scope of the present teachings. For example, the power level at some point prior to the output transistor 118 may be monitored by a diode type or alternative type envelope detector placed at the input of the amplifier 110 or at an interstage point in the signal path of the amplifier 110, as would be apparent to one of ordinary skill in the art. In this case the direct comparison of the negative peak of the carrier envelope with a predetermined value is not explicitly in force, but is accomplished by the implied relationship between the signal level at the point of detection and the signal level at the output stage.

FIG. 6 also shows an illustrative circuit configuration of the detector encoder 230, according to a representative embodiment. The first comparator 520 representatively includes first and second transistors 521 and 522, which are FETs in the depicted embodiment, although other types of transistors may be incorporated without departing from the scope of the present at teachings. The drain of FET 522 is representatively connected to first output port 528. The gate of the first transistor 521 is connected to the encoder input port 510 to receive the analog detection signal DetA from the detector 150. The gate of the second transistor 522 is connected to a fixed first reference voltage, which is about 1.25V in the depicted example. Generally, the first reference voltage is the critical voltage at which the drain supply for the output transistor 118 of the amplifier 110 must be boosted. In addition, the input 510 may be connected to receive the voltage Vout from the power switch 210.

The second comparator 530 representatively includes first and second transistors 531 and 532, which are FETs in the depicted embodiment, although other types of transistors may be incorporated without departing from the scope of the present at teachings. The drain of FET 532 is representatively connected to second output port 538. The gate of the first transistor 531 is connected to an output of the level shifter 540 to receive the voltage level shifted detector signal DetA. The gate of the second transistor 532 is connected to a second reference voltage, which is Vdd/2 in the depicted example.

In the depicted embodiment, the level shifter 540 includes representative diodes D541 and D542 and voltage divider 550. The diodes D541 and D542 are connected in series between the encoder input port 510 the voltage divider 545. The voltage divider 545 includes resistor R543 connected between the diode D542 and the gate of the first transistor 531, and resistor R544 connected between the gate of the first transistor 531 and ground.

As stated above, the purpose of the detector encoder 230 is to convert the analog detection signal DetA output by the detector 150 into a two bit digital word, having first and second detection bits Det1 and Det2, which are output at first and second output ports 528 and 538, respectively. When the analog detection signal DetA falls below the critical voltage (e.g., 1.25V), at which the drain supply for the output transistor 118 of the amplifier 110 must be boosted to about 2*Vdd, the first detection bit Det1 output by the first comparator 520 goes low. This may be accomplished by setting the first reference voltage of the first comparator 520 to 1.25V in the depicted example. Meanwhile, the second reference voltage of the second comparator 530 has a value of Vdd/2, which is about 1.65V for a supply voltage Vdd of about 3.3V, for example. Thus, the second detection bit Det2 output by the second comparator 530 is also low when the analog detection signal DetA falls below the critical voltage. Referring to Table 1, this condition results in first and second input signals In1 and In2 provided to the power switch 210 having high and low values, respectively, which triggers the DC controller 130 to produce the boosted voltage Vboost (boost state) as the output voltage Vout.

Once the boosted voltage Vboost is provided, the drain supply voltage of the output transistor 118 increases by about 3.3V, for example, mitigating the condition which triggered the boost state. However, as discussed above, the DC controller 130 continues to produce the boosted voltage Vboost as the output voltage Vout until the second detection bit Det2 output by the second comparator 530 goes high. Due to the level shifter 540, the second comparator 530 is not triggered high until the voltage of the analog detection signal DetA output by the detector 150 rises to a level substantially higher than that which triggered the boost state, including a hysteresis voltage margin. With hysteresis in place, the amplifier circuit 100 is forced to recover substantially from the condition of drain supply voltage being too low before the boost state is turned off, which prevents unnecessary switching and provides protection from oscillation in the amplifier circuit 100.

In other words, the hysteresis is provided by invocation of two separate threshold voltages (e.g., 1.25V and Vdd/2), together with two different representations of the detector voltage, the second representation being facilitated by the level shifter 540. According to this configuration, the switching threshold depends on the direction of the power level change, such that the boost state is invoked at a more nearly compressed point of operation of the output transistor 118 than is occurring just after the boost state is extinguished. The result is that no single fixed power level will cause the DC controller 130 to be indecisive as to which state it should be in.

Referring again to FIG. 6, the first comparator 520 is referenced to a fixed (substantially absolute with respect to Vdd) first reference voltage, while the second comparator 530 is referenced to a second reference voltage that is a scaled fraction of Vdd (e.g., Vdd/2), as discussed above. This is because the first comparator 520 is responsible for instigating the boost state, responsive to a condition in which the drain supply voltage of the output transistor 118 is inadequate compared with the RF power level demanded. The first reference voltage is therefore fixed to the saturation voltage for the output transistor 118, which is substantially constant. Thus, the first comparator 520 is referenced to a fixed voltage. The second comparator 530 must be referenced to something that tracks the supply voltage Vdd because the point at which the boost state is switched off depends on the value of the boosted voltage Vboost, which is on the order of the supply voltage Vdd.

Assuming for purposes of illustration that a condition occurs which requires application of the boosted voltage Vboost, the outputs of the first comparator 520 and the second comparator 530 are both low, as discussed above. Referring to FIG. 6, as soon as the boosted voltage Vboost is provided, the voltage value V1 of the analog detection signal DetA is determined by Equation (1):

$$V1 = Vc + Vb + 0.75V \tag{1}$$

In Equation (1), Vc is the voltage swing minimum (critical voltage) at which the boost state is needed to keep the output transistor 118 out of compression. As discussed above, the voltage boost Vb is the additional voltage (e.g., stored in charge storage capacitor C349) by which the supply voltage Vdd is boosted, as provided by the DC controller 130, which is usually about the same value as the supply voltage Vdd, so that the boosted voltage Vboost is about twice Vdd. The diode drop on the diode wired output transistor 118 of the detector 150, represented by diode D155, is about 0.75V. Accordingly, the boost state becomes necessary when the voltage value of the analog detection signal DetA meets the following condition:

$$V1 = Vc + 0.75V \tag{2}$$

Once the boosted voltage Vboost has been provided, the voltage value of the analog detection signal DetA exceeds 1.25V, as indicated by Equation (1), so the output of the first comparator 520 goes high. According to the topology of the DC controller 130, the boost state does not extinguish until the output of second comparator 530 goes high, which occurs when V2 exceeds Vdd/2.

When the boost state is ready to turn off, V2 may be represented by Equation (3), as follows:

$$V2 = (Vc + Vb + Vh + 0.75V - n*0.7V)*(R2/(R1+R2)) \tag{3}$$

In Equation (3), Vh is hysteresis voltage and n is the number of diodes (e.g., diodes D541 and D542) used to form the level shifter between V1 and V2, where and each diode has a drop of about 0.7V, for example. At the threshold of boost extinguishment, V2 is equal to Vdd/2, as shown in Equation (4):

$$(Vc + Vb + Vh + 0.75V - n*0.7V)*(R2/(R1+R2)) = Vdd/2 \tag{4}$$

Substituting Vdd for the voltage boost Vb, Equation (4) may be re-written as shown in Equation (5):

$$(Vc + Vdd + Vh + 0.75V - n*0.7V)*(R2/(R1+R2)) = Vdd/2 \tag{5}$$

It becomes apparent that the system can achieve independence from the supply voltage Vdd if $R2/(R1+R2) = 0.5$, and $R1 = R2$. Thus, Equation (5) may be re-written as shown in Equation (6):

$$Vc + Vh + 0.75V - n*0.7V = 0 \tag{6}$$

A practical solution for Equation (6) is Vc=0.5V, Vh=0.15V and n=2, for example. In other words, this represents a critical voltage Vc of 0.5V, a hysteresis voltage Vh of 0.15V and two diodes (e.g., D541 and D542) in the level shifter 540. Under this condition, the drain swing minimum of the output transistor 118 must reach the point where it will be 0.15V higher than Vc when the boost state is off in order to extinguish the boost state. Stated differently, when the boost state switches off, there is at least 0.15V of margin before the boost state will switch back on again. Some degree of empirical optimization is needed to set these values for best operation, and the final solution may require a somewhat larger hysteresis voltage.

Figure 7:
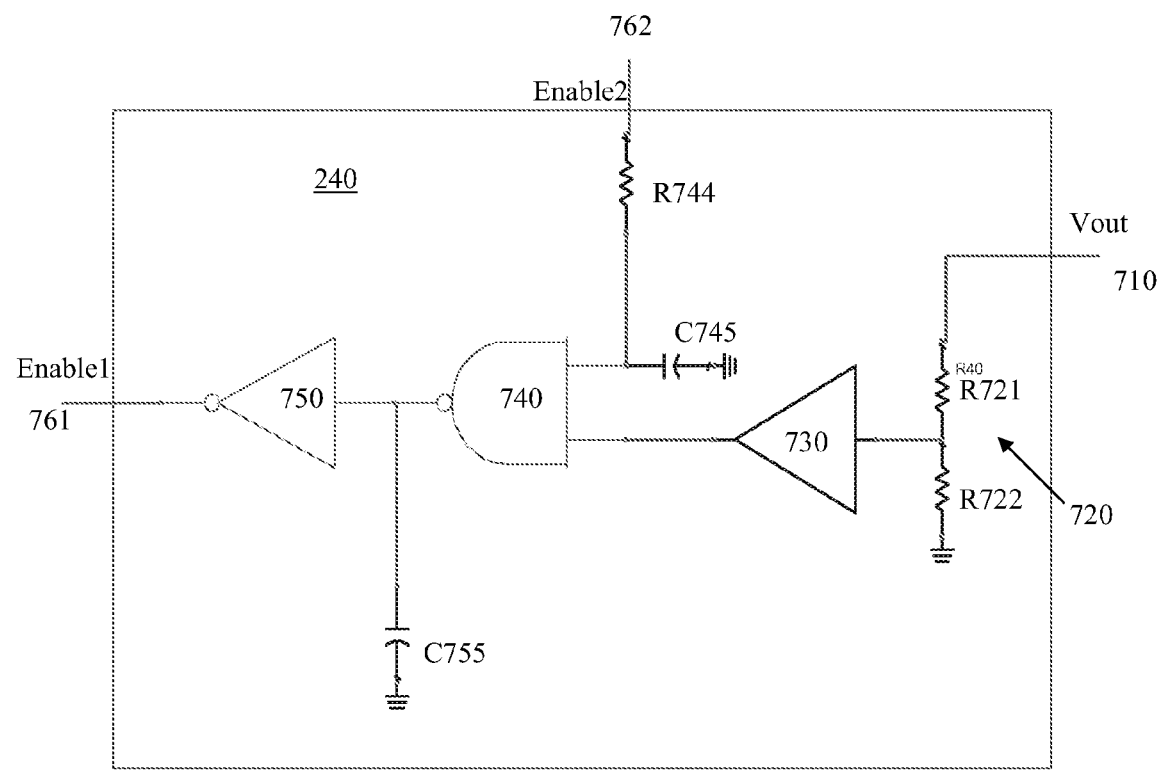
FIG. 7 is a circuit diagram illustrating a fault detector of the DC controller, according to a representative embodiment.

FIG. 7 is a circuit diagram illustrating fault detector 240 of the DC controller 130, according to a representative embodiment.

In various embodiments, the fault detector 240 determines if the charge storage capacitor C349 of the power switch 210 has sufficient charge to produce an adequate level of voltage boost. If the charge storage capacitor C349 does not have sufficient charge, then the first enable signal Enable1, output from first output port 761, goes high, which in turn disables the switch sequencer 220. The DC controller 130 thus simply remains in the pass-through state, in which case the charge storage capacitor C349 is connected across the supply voltage Vdd where it can obtain charge recovery.

Referring to FIG. 7, the fault detector 240 includes input port 710, which receives the output voltage Vout from the power switch 210. The input port 710 is connected to resistive divider circuit 720, which includes resistor 721 connected between the input port 710 and an input to comparator 73 and resistor 722 connected between the input to the comparator 730 and ground. The resistive divider circuit 720 samples the DC voltage Vout produced at the output of the power switch 210. This sampled voltage is compared with Vdd/2 in the comparator 730.

The fault detector 240 further includes NAND gate 740. Inputs of NAND gate 740 are fed by the output of the comparator 730 and a second enable signal Enable2 taken from the power switch 210 at a point that is high when the power switch 210 is in the boost state. For example, the second enable signal Enable2 may be taken from a point between the fourth driver 338 and the charge storage capacitor C349. Thus, the fault detector 240 is enabled only in the boost state. An R-C coupling network, including representative resistor R744 and capacitors C745 and C755, ensures that the boost state has settled before the fault detector is enabled, where the resistor R744 is connected between the power switch 210 and an input of NAND gate 740, the capacitor C745 is connected between the input of NAND gate 740 and ground, and the capacitor C755 is connected between the output of NAND gate 740 and ground. The resistor R744 may have a value of about 2 k Ohm and the capacitors C745 and C755 may have value of about 1 pF, for example, although the resistance and capacitance values may vary to provide unique benefits for any particular situation or to meet application specific design requirements of various implementations, as would be apparent to one skilled in the art.

The output of the NAND gate 740 is also connected to an input of inverter 750, which corrects the logic and provides a lasting disable state that ensures complete charge recovery of the charge storage capacitor C349 before the fault is extinguished. The inverter 750 may be referred to as a relaxation inverter, and an illustrative configuration of the inverter 750 is shown in FIG. 8.

Figure 8:
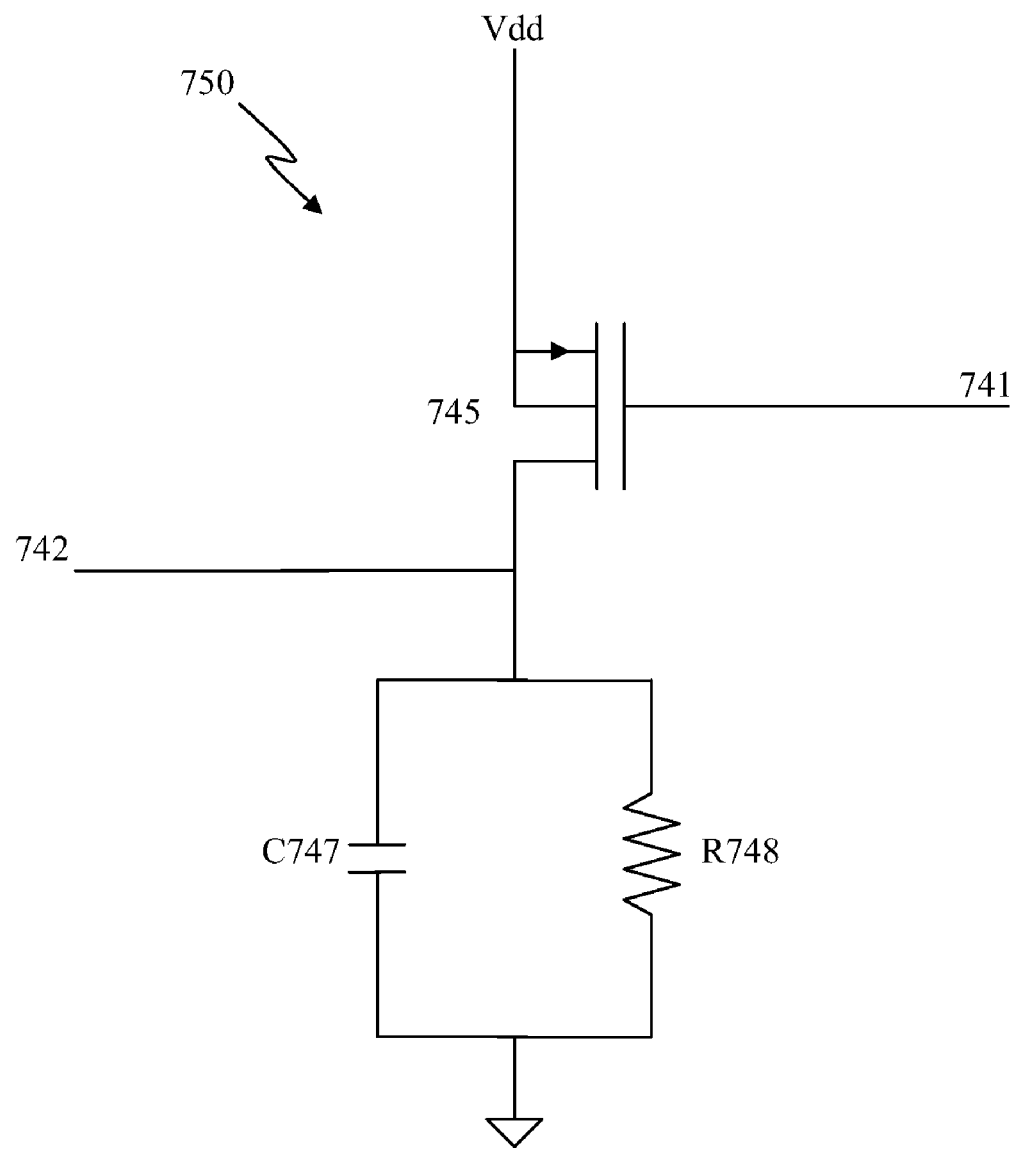
FIG. 8 is a circuit diagram illustrating a relaxation inverter of the fault detector, according to a representative embodiment.

More particularly, FIG. 8 is a circuit diagram illustrating a relaxation inverter 750 of the fault detector 240, according to a representative embodiment.

Referring to FIG. 8, the inverter 750 includes transistor 745, which is a FET in the depicted embodiment, although other types of transistors may be incorporated without departing from the scope of the present at teachings. The transistor 745 includes a gate connected to the input port 741, a source connected to the supply voltage Vdd and a drain connected to the output port 742. The inverter 750 also has an R-C circuit including resistor R748 and capacitor C747 connected in parallel with one another between the output port 742 and ground. The resistor R748 may have a value of about 25 kOhm and the capacitor C747 may have a value of about 20 pF, for example, although the resistance and capacitance values may vary to provide unique benefits for any particular situation or to meet application specific design requirements of various implementations, as would be apparent to one skilled in the art.

In the depicted illustrative configuration, the inverter 750 is capable of rapid transition from output low to output high states, but the reverse transition from output high to output low states is slow. That is, the output high state will be held by the inverter 750 for a length of time sufficient for the capacitor C747 to discharge into the resistor R748. This behavior allows the fault detector 240 to disable the boost state immediately upon detection of a fault, while providing ample time in the disabled mode for the charge storage capacitor C349 of the power switch 210 to completely recharge. A condition that may cause the fault described above is the presence of excessive RF power applied to the power amplifier 110, for example, under which condition the boost state may be demanded for an inordinate percentage of the time, resulting in discharge of the charge storage capacitor 349.

Figure 9:
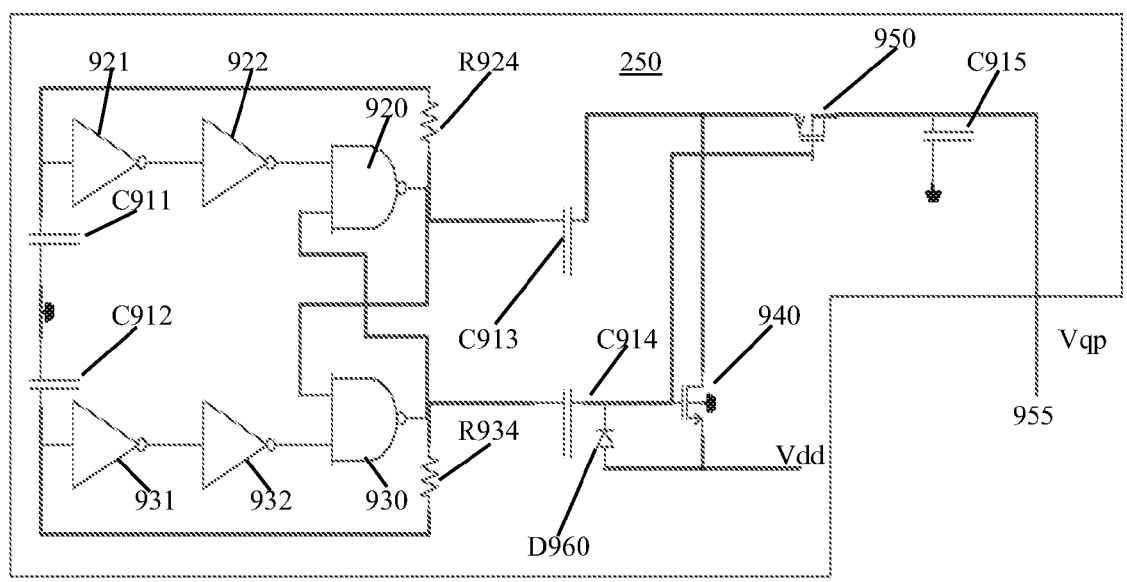
FIG. 9 is a circuit diagram illustrating a charge pump voltage source of the DC controller, according to a representative embodiment.

FIG. 9 is a circuit diagram illustrating charge pump voltage source 250 of the DC controller 130, according to a representative embodiment.

As discussed above with reference to FIG. 3, a charge pump voltage Vqp of about 6.3V, for example, is provided to keep the capacitor C312 of the power switch 210 charged up. In various embodiments, the charge pump voltage Vqp is provided by the charge pump voltage source 250.

Referring to FIG. 9, the charge pump voltage source 250 includes transistor 940 and transistor 950, which are FETs in the depicted embodiment, although other types of transistors may be incorporated without departing from the scope of the present at teachings. Transistor 940 has a source connected to the voltage source to receive supply voltage Vdd and to an anode of diode 960, a drain connected to a source of transistor 950, and a gate connected to a gate of the transistor 950 and a cathode of the diode D960. Transistor 950 has a drain connected to output port 955 for outputting the charge pump voltage Vqp. A gate of the transistor 940 is also connected to an output of NAND gate 930 through a capacitor C914, and a source of the transistor 950 is connected to an output of NAND gate 920 through a capacitor C913.

One input of NAND gate 920 is connected to representative series inverters 921 and 922, and the other input is connected to the output of NAND gate 930. Likewise, one input of NAND gate 930 is connected to representative series inverters 931 and 932, and the other input is connected to the output of NAND gate 920. The output of NAND gate 920 is also connected to the input of the corresponding first inverter 921 through resistor R924, and the output of NAND gate 930 is also connected to the input of the corresponding first inverter 931 through resistor R934 (no reference designator depicted in figure). Capacitors C911-C912 are connected between the inputs of inverters 921 and 931, respectively, and ground. The resistance values of resistors R924 and R934, as well as the values of the capacitors C911-C915, may vary to provide unique benefits for any particular situation or to meet application specific design requirements of various implementations, as would be apparent to one skilled in the art.

As can be seen in the depicted representative embodiment, the charge pump voltage source 250 has a simple flip-flop type multi-vibrator followed by a voltage doubler, including the NAND gates 920, 930 and the corresponding inverters 921, 922 and 931, 932. The transistors 940 and 950 act as rectifiers with essentially zero voltage drop, hence almost 6.6V (e.g., about 6.3V), for example, can be obtained from a 3.3V supply, such as from battery 115. Of course, alternative configurations for providing the charge pump voltage Vqp may be incorporated without departing from the scope of the present teachings.

Figure 10:
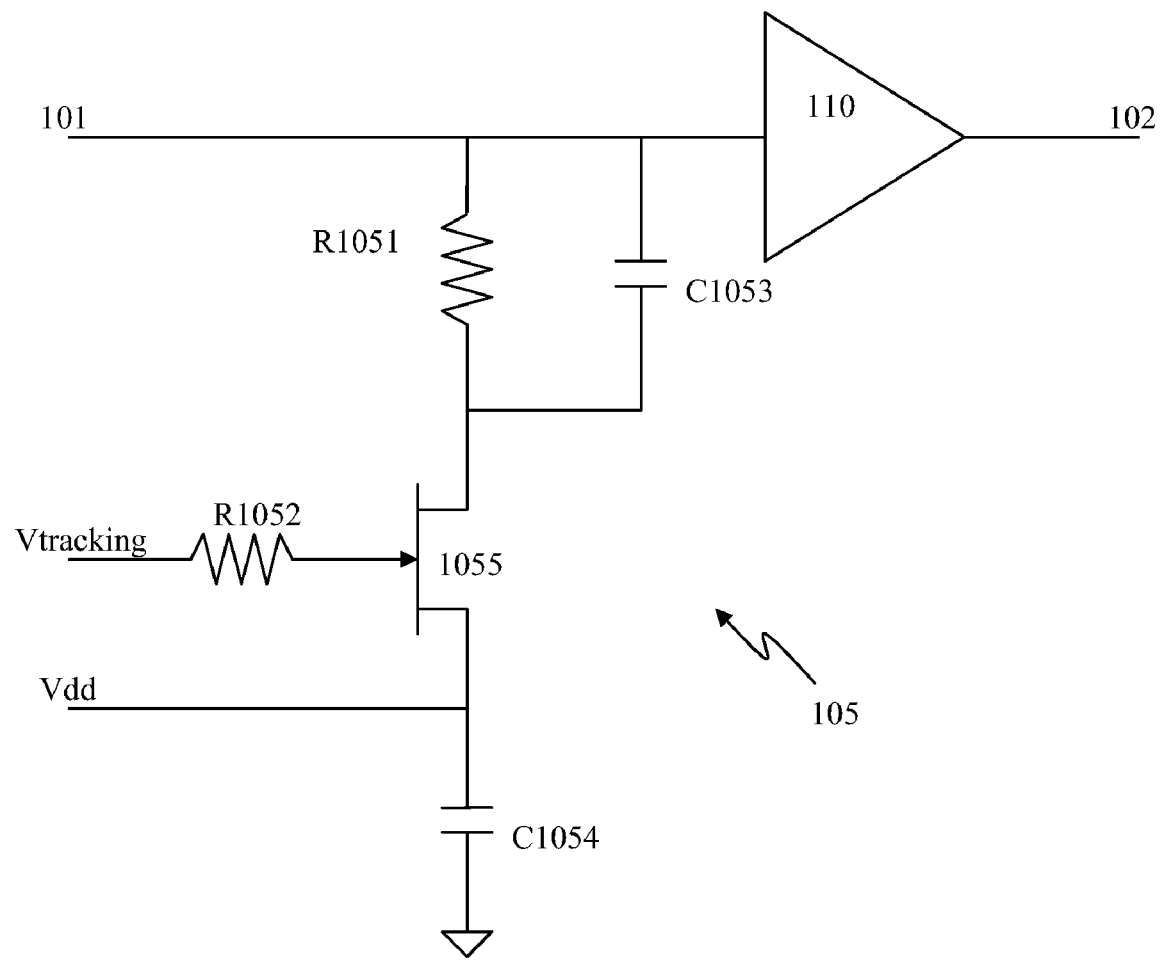
FIG. 10 is a circuit diagram illustrating an attenuator of the amplifier control circuit, according to a representative embodiment.

FIG. 10 is a circuit diagram illustrating attenuator 105 of the amplifier circuit 100, according to a representative embodiment.

As stated above, a step in the drain supply voltage of the output transistor 118 in the amplifier 110, e.g., occurring during the boost state, may be accompanied by a step in gain amplitude and/or phase of the amplifier 110. FIG. 10 depicts an illustrative configuration of a compensation circuit in the attenuator 105 that corrects this effect, according to various embodiments, although other approaches may be incorporated without departing from the scope of the present teachings.

Referring to FIG. 10, the attenuator 105 is connected between the signal input port 101 and the amplifier 110, and includes transistor 1055, which is an enhancement mode FET in the depicted embodiment, although other types of transistors may be incorporated without departing from the scope of the present at teachings. A drain of the transistor 1055 is connected to the signal input port 101 through shunt elements, which include R1051 connected in parallel with capacitor C1053. A source of the transistor 1055 is connected to the voltage source to receive supply voltage Vdd, and to ground through capacitor 1054. A gate of the transistor 1055 is connected to a voltage Vtracking which tracks the output Vout of the DC Controller 130 through resistor R1052. The resistor R1051 may range in value from about 0 to about 1 kOhm, for example, as needed to provide the correct amount of gain compensation. Capacitor C 1053 may range in value from about 0 to about 1 pF, for example, to provide the correct amount of phase compensation. Resistor R1052 may have a value of about 10 kOhm and capacitor C 1054, which is not critical to circuit performance, may have a value of about 1 pF, for example. The resistance and capacitance values of R1051 and C1053 may vary to provide unique benefits for any particular situation or to meet application specific design requirements of various implementations, as would be apparent to one skilled in the art.

In the depicted embodiment, the transistor 1055 acts as a switch to switch in resistor R1051 and capacitor C1053 as shunt elements on the input line of the amplifier 110 whenever the power switch 210 is in the boost state, as indicated by the tracking voltage Vtracking (which tracks the output voltage Vout of the power switch 210). For instance, the tracking voltage Vtracking may be identical to Vout. The shunt elements remove any step in the gain amplitude and/or phase of the input RF signal resulting from the increase in the drain supply voltage of the output transistor 118. The source of the transistor 1055 is biased to the supply voltage Vdd (e.g., 3.3V). Therefore, when the tracking voltage Vtracking is at 3.3V, indicating that the power switch 210 is not in the boost state, the transistor 1055 is off In an alternative embodiment, the compensation circuit may be placed in the inter-stage, where it is isolated from the effects of input source loading, for example. In any event, the values of the shunt elements, resistor R1051 and capacitor C1053, may be adjusted to remove any discontinuity in gain and phase (complex gain) of the amplifier 110 as the drain supply voltage to the output transistor 118 of the amplifier 110 is switched between the pass-through state (e.g., Vdd) and the boost state (e.g., 2*Vdd).

It is understood that the values of various components of the amplifier circuit 100, including the resistance, capacitance and inductor values, may vary to provide unique benefits for any particular situation or to meet application specific design requirements of various implementations, as would be apparent to one skilled in the art. It is further understood that the types of transistors may vary, as discussed above, and that the sources/drains of the various transistors may be reversed, without affecting the relevant functionality, depending on design factors of various embodiments.

Accordingly, the supply voltage of the output transistor 118 in the amplifier 110 may be selectively boosted, in response to demand on the amplifier 110. For example, a supply voltage may be initially provided by the power switch 210 as the drain supply voltage by turning on the switching transistor 312 to connect the supply voltage Vdd directly to the power amplifier 110. A magnitude of an envelope of the RF signal received by the amplifier 110 is evaluated by the detector 150 (and the detector encoder 230), so that it may be determined when a lowest occurring voltage extreme of the envelope becomes less than a predetermined voltage level. The power switch 210 then provides a boosted voltage Vboost as the drain supply voltage of the output transistor 118 when the lowest occurring voltage extreme of the envelope becomes less than the predetermined voltage level by turning off the switching transistor 312 and turning on transistor 338. The boosted voltage Vboost includes the supply voltage Vdd plus a voltage boost Vb previously stored in the charge storage capacitor 349. Subsequently, when it is determined that the lowest occurring voltage extreme of the envelope becomes greater than the predetermined voltage level, the power switch 210 again provides the supply voltage Vdd as the drain supply voltage by turning on the switching transistor 312 and turning off transistor 338. This occurs after an additional margin of amplifier power demand recovery to avoid premature switching back to the supply voltage Vdd from the boosted voltage Vboost.

The various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. An apparatus for controlling operation of a power amplifier configured to amplify a radio frequency (RF) signal, the apparatus comprising:
 a detector configured to detect a power level of the RF signal with respect to a predetermined power threshold and to generate a corresponding analog detection signal indicating the power level of the RF signal; and
 a controller comprising a detector encoder, configured to translate the analog detection signal into a plurality of digital detection signals, and a power switch comprising a switching transistor and a charge storage capacitor, the controller providing a control voltage to an output transistor of the amplifier based on the plurality of digital detection signals,
 wherein the control voltage has a low voltage value, which is substantially the same as a value of a supply voltage, when the detection signal indicates that the power level is below the power threshold, and the control voltage having a high voltage value when the detection signal indicates that the power level is above the power threshold, the high voltage value being about twice the low voltage value, wherein the controller generates the high voltage value by boosting the supply voltage, and wherein:

when the detection signal indicates that the power level is below the power threshold, the switching transistor is turned on to pass the supply voltage to an output of the power switch, and the charge storage capacitor is connected between the supply voltage and ground to charge the charge storage capacitor to a capacitor voltage that is about equal to the supply voltage, so that the control voltage has the supply voltage value; and when the detection signal indicates that the power level is above the power threshold, the switching transistor is turned off to disconnect the supply voltage from the output of the power switch, and the charge storage capacitor is connected between the supply voltage and the output of the power switch, so that the control voltage has a sum of the capacitor voltage and the supply voltage.

2. The apparatus of claim 1, wherein the controller is further configured to increase the control voltage from the low voltage value to the high voltage value substantially immediately once the detection signal indicates that the power level has increased above the power threshold, and to decrease the control voltage from the high voltage value to the low voltage value once the detection signal indicates that the power level has decreased below a variable power threshold higher than the power threshold.

3. The apparatus of claim 1, wherein the power threshold corresponds to saturation of the output transistor.

4. The apparatus of claim 3, wherein the detector detects the power level by evaluating a magnitude of an envelope of the RF signal.

5. The apparatus of claim 4, wherein the detector evaluates the magnitude of the envelope by determining when a lowest occurring voltage extreme of the envelope becomes less than a predetermined voltage level.

6. The apparatus of claim 1, wherein the controller further comprises:

a switch sequencer configured to translate the plurality of digital detection signals from the detector encoder into a plurality of input signals provided to the power switch in a sequence that prevents the charge storage capacitor from being shorted by the switching transistor.

7. A control device for controlling a power amplifier configured to amplify a radio frequency (RF) signal, the device comprising:

a detector encoder configured to receive an analog detection signal from a detector and to translate the detection signal into a plurality of digital detection signals, the analog detection signal indicating a power level of the RF signal;

a switch sequencer configured to translate the plurality of digital detection signals from the detector encoder into a plurality of input signals in a predetermined sequence; and a power switch configured to provide an output voltage to the power amplifier in response to the plurality of input signals received from the switch sequencer, the output voltage having a first value corresponding to a supply voltage from a supply voltage source when the power level of the RF signal is below a predetermined power threshold, and having a second value corresponding to the supply voltage plus a voltage boost when the power level of the RF signal is above the power threshold, wherein the second value of the output voltage enables the power amplifier to operate above saturation voltage when the power level is above the power threshold.

8. The device of claim 7, wherein the power switch comprises:

a switching transistor connected between the supply voltage source and an output of the control device, which provides the output voltage to the power amplifier, a gate of the switching transistor being connected to a first switch input of the power switch through a first driver, the first switch input receiving a first input signal of the plurality of input signals from the switch sequencer; and a charge storage capacitor connected between the output of the control device and a capacitor node, which is connected to a second switch input of the power switch through at least one second driver, the second switch input receiving a second input signal of the plurality of input signals from the switch sequencer, wherein the switching transistor is turned on and the capacitor node is connected to ground when the plurality of input signals indicate that the power level of the RF signal is below the power threshold, so that the output voltage is equal to the supply voltage passed through the switching transistor and the charge storage capacitor is charged to the voltage boost, and wherein the switching transistor is turned off and the capacitor node is connected to the supply voltage source when the plurality of input signals indicate that the power level of the RF signal is above the power threshold, so that the output voltage is equal to the supply voltage plus the voltage boost from the charge storage capacitor.

9. The device of claim 8, wherein the analog detection signal corresponds to a lowest occurring voltage extreme of an envelope of the RF signal, and indicates that the power level of the RF signal is above the power threshold when the lowest occurring voltage extreme of the envelope of the RF signal becomes less than a predetermined voltage level.

10. The device of claim 9, wherein the detector encoder comprises:

a first comparator connected to an encoder input to receive the analog detection signal from the detector, the first comparator being configured to compare the analog detection signal with a first reference voltage having a predetermined fixed value, and to output a first digital detection signal to the switch sequencer;

a level shifter connected to the encoder input to receive the analog detection signal from the detector, the level shifter being configured to shift a voltage level of the analog detection signal; and a second comparator connected to an output of the level shifter to receive the level shifted analog detection signal, the second comparator being configured to compare the level shifted analog detection signal with a second reference voltage having a value derived from the supply voltage.

11. The device of claim 10, wherein the level shifter comprises a plurality of diodes and a voltage divider connected in series between the encoder input and the second comparator.

12. The device of claim 10, wherein the predetermined fixed value of the first reference voltage is a critical voltage at which a drain supply for an output transistor of the power amplifier must be boosted to the second value, and the value of the second reference voltage is about half the supply voltage.

13. The device of claim 12, wherein, due to the level shifted analog detection signal, the second digital detection signal output by the second comparator is not triggered high until a voltage level of the drain supply rises substantially higher than the critical voltage, including a hysteresis voltage margin.

14. The device of claim 10, wherein the switch sequencer comprises:
   a flip-flop circuit connected to first and second sequencer inputs to receive the first and second digital detection signals, respectively;
   an inverter having an input connected to an output of the flip-flop circuit;
   a first NAND gate having a first input connected to the output of the flip-flop circuit and a second input connected to an output of a second NAND gate; and
   the second NAND gate having a first input connected to an output of the inverter and a second input connected to an output of the first NAND gate,
   wherein the output of the first NAND gate provides the first input signal to the power switch and the output of the second NAND gate provides the second input signal to the power switch.

15. The device of claim 14, wherein the power switch further comprises:
   a capacitor connected between the gate of the switching transistor and the first driver; and
   a charge pump voltage circuit connected between a charge pump voltage source and the capacitor to charge the capacitor to a capacitor voltage approximately equal to the supply voltage, the capacitor voltage being added to a driver voltage of the first driver to supply an enhanced gate voltage to the switching transistor.

16. The device of claim 15, wherein the second driver comprises an inverter having a first transistor, gated to the second switch input and connected between a drain of the switching transistor and the charge storage capacitor, and a second transistor, gated to the second switch input and connected between the charge storage capacitor and ground.

17. The device of claim 16, wherein, when the switching transistor and a second transistor of the second driver are turned on and the first transistor of the second driver is turned off, the output voltage of the power switch has the first value, and when the switching transistor and the second transistor of the second driver are turned off, and the first transistor of the second driver is turned on, the output voltage of the power switch has the second value.

18. A method of selectively boosting a drain supply voltage of an output transistor in a power amplifier amplifying a radio frequency (RF) signal, the method comprising:
   evaluating magnitude of an envelope of the RF signal and detecting a lowest occurring voltage extreme of the envelope;
   outputting an analog detection signal indicating the detected lowest occurring voltage extreme;
   translating the analog detection signal into a plurality of digital detection signals;
   providing a supply voltage as the drain supply voltage by turning on a switching transistor to directly connect a supply voltage source to the output transistor, and connecting a charge storage capacitor between the supply voltage source and ground to charge the capacitor to a voltage boost value, in response to the digital detection signals, when the detected lowest occurring voltage extreme is greater than a predetermined voltage level; and
   providing a boosted voltage as the drain supply voltage by turning off the switching transistor and connecting the charge storage capacitor between the supply voltage source and the output transistor, in response to the digital detection signals, when the detected lowest occurring voltage extreme becomes less than the predetermined voltage level, the boosted voltage comprising the supply voltage plus the voltage boost value previously stored in the charge storage capacitor.

* * * * *